(12) United States Patent
Takebe (10) Patent No.: US 9,223,200 B2
(45) Date of Patent: Dec. 29, 2015

(54) PELLICLE FOR LITHOGRAPHY, PELLICLE-MOUNTED PHOTOMASK, AND EXPOSURE TREATMENT METHOD

(71) Applicant: ASAHI GLASS COMPANY, LIMITED, Chiyoda-ku (JP)

(72) Inventor: Yoko Takebe, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 187 days.

(21) Appl. No.: 14/167,210

(22) Filed: Jan. 29, 2014

(65) Prior Publication Data

US 2014/0147773 A1 May 29, 2014

Related U.S. Application Data

(63) Continuation of application No. PCT/JP2012/069234, filed on Jul. 27, 2012.

(30) Foreign Application Priority Data

Jul. 29, 2011 (JP) ................................. 2011-166547

(51) Int. Cl.
*G03F 1/62* (2012.01)
*G03F 1/00* (2012.01)

(52) U.S. Cl.
CPC . *G03F 1/62* (2013.01); *G03F 1/142* (2013.01)

(58) Field of Classification Search
CPC .................................. G03F 1/62; G03F 1/142

USPC ............................................................ 430/5
See application file for complete search history.

(56) References Cited

FOREIGN PATENT DOCUMENTS

| JP | 3-67262 | 3/1991 |
|---|---|---|
| JP | 7-295207 | 11/1995 |
| JP | 8-123013 | 5/1996 |
| JP | 11-246726 | 7/1999 |
| JP | 2952962 | 7/1999 |
| JP | 3818344 | 6/2006 |
| JP | 4000231 | 8/2007 |

OTHER PUBLICATIONS

International Search Report issued Sep. 4, 2012 in PCT/JP2012/069234 filed Jul. 27, 2012.

*Primary Examiner* — Christopher Young
(74) *Attorney, Agent, or Firm* — Oblon, McClelland, Maier & Neustadt, L.L.P.

(57) ABSTRACT

To provide a pellicle for lithography having a pellicle membrane excellent in light resistance against light with a wavelength of at most 250 nm, particularly at most 200 nm, a pellicle-mounted photomask using it, and an exposure treatment method. A pellicle for lithography having a multilayer pellicle membrane including a membrane made of a fluoropolymer (A) which contains, as the main component, repeating units obtained by cyclopolymerization of a pertluorodiene having one etheric oxygen atom, and a membrane made of a fluoropolymer (B) which has fluorinated alicyclic ring structures each containing, in the ring structure, two or three etheric oxygen atoms not being adjacent to one another, wherein the total thickness of the membrane made of the fluoropolymer (B) is at most 40% of the total thickness of the membrane made of the fluoropolymer (A).

10 Claims, 2 Drawing Sheets

PELLICLE FOR LITHOGRAPHY, PELLICLE-MOUNTED PHOTOMASK, AND EXPOSURE TREATMENT METHOD

TECHNICAL FIELD

The present invention relates to a pellicle for lithography having a multilayer pellicle membrane, a pellicle-mounted photomask, and an exposure treatment method.

BACKGROUND ART

Heretofore, there has been a lithography step as one step in a process for producing a semiconductor device or a liquid crystal display panel. In the lithography step, a resist film formed on a substrate is subjected to exposure treatment via a photomask (which may be one so-called "reticle"), so that a pattern formed on the photomask is transferred to the resist film. If foreign material is deposited on the pattern of the photomask, a pattern defect will result. Therefore, in order to prevent deposition of foreign material, a pellicle is mounted on the photomask.

Usually, a pellicle has such a structure that a transparent thin membrane (hereinafter referred to as a "pellicle membrane") to transmit light with a wavelength of an exposure light source, is bonded to a frame via an adhesive, and is installed so that a certain distance is maintained between the pellicle membrane and the mask surface of the photomask. By this distance, even if foreign material is deposited on the pellicle membrane, it will be out of focus and will present no influence on image formation.

Heretofore, as an exposure light source to be used at the time of producing a semiconductor device or a liquid crystal display panel, an i-line light source (wavelength: 365 nm) has been predominant, and as a material for a pellicle membrane, a cellulose-type polymer such as nitrocellulose, cellulose acetate or cellulose propionate has been used.

In the fields of semiconductor devices and liquid crystal display panels, minimization of wiring and wiring interval has been in progress. Accordingly, a short wavelength has become to be selected for use as the wavelength of a light source to be used in the lithography step. The process using an i-line light source which used to be predominant, was intended for a minimum pattern dimension of at least 0.3 µm as the target. Whereas, in recent years, in order to process wiring for a minimum pattern dimension of less than 0.3 µm, a process has been introduced which uses, as an exposure light source, a light source with a wavelength of at most 250 nm such as a KrF excimer laser (248 nm) or an ArF excimer laser (193 nm).

However, in a case where such light with a short wavelength is used as an exposure light source, the light resistance tends to be insufficient with the cellulose-type membrane material which used to be used as a material for a pellicle membrane.

In connection with such a problem, it has been found that an amorphous perfluoropolymer is useful as a material for a pellicle membrane, and various studies have been made (Patent Document 1). For example, Patent Document 2 discloses a pellicle membrane having a fluorinated layer formed on its surface, which is prepared by treating a membrane made of an amorphous perfluoropolymer with fluorine gas. Patent Document 3 discloses a pellicle membrane made of a multilayer membrane of at least two types of amorphous fluoropolymers.

PRIOR ART DOCUMENTS

Patent Documents

Patent Document 1: Japanese Patent No. 2,952,962
Patent Document 2: Japanese Patent No. 4,000,231
Patent Document 3: JP-A-7-295207

DISCLOSURE OF INVENTION

Technical Problem

However, even if amorphous perfluoropolymers as mentioned above are used, the light resistance against light with a wavelength of at most 250 nm, particularly with a wavelength of at most 200 nm, is insufficient.

For example, the pellicle membrane made of a polymer having a fluorinated alicyclic ring structure, as used in Patent Document 1, is susceptible to deterioration under irradiation with an ArF excimer laser light, although it has a high transparency to the ArF excimer laser light, and if irradiated for a long period of time, it is likely to undergo a decrease in the membrane thickness and a decrease in the transparency.

In the case of the pellicle membrane disclosed in Patent Document 2, fluorination is carried out after the membrane formation, whereby variation is likely to result in the performance of the pellicle, and besides, laser light resistance for a long period of time cannot be expected solely by formation of such a slim fluorinated layer.

The multilayer pellicle disclosed in Patent Document 3 has good strength immediately after its production, but when it is irradiated with an ArF excimer laser light, the strength tends to decrease, and the membrane breakage is likely to occur.

Thus, a highly light resistant pellicle membrane is desired which is little susceptible to e.g. a decrease in the membrane thickness or a decrease in the membrane strength for a long period of time, even when irradiated with light having a wavelength of at most 250 nm, particularly at most 200 nm, but a material which fully satisfies such requirements has not been known.

The present invention has been made in view of the above situations and is to provide a pellicle for lithography having a pellicle membrane excellent in light resistance against light with a wavelength of at most 250 nm, particularly at most 200 nm, a pellicle-mounted photomask using such a pellicle, and an exposure treatment method.

Solution to Problem

The present invention provides the following [1] to [10].
[1] A pellicle for lithography having a multilayer pellicle membrane including a membrane made of a fluoropolymer (A) which contains, as the main component, repeating units obtained by cyclopolymerization of a perfluorodiene having one etheric oxygen atom, and a membrane made of a fluoropolymer (B) which has fluorinated alicyclic ring structures each containing, in the ring structure, two or three etheric oxygen atoms not being adjacent to one another, wherein the total thickness of the membrane made of the fluoropolymer (B) is at most 40% of the total thickness of the membrane made of the fluoropolymer (A).
[2] The pellicle for lithography according to [1], wherein the multilayer pellicle membrane is a multilayer pellicle membrane having a membrane made of the fluoropolymer (B) laminated on one side or each side of the membrane made of the fluoropolymer (A).

[3] The pellicle for lithography according to [1] or [2], wherein the multilayer pellicle membrane has a two-layer structure having a membrane made of the fluoropolymer (B) laminated on one side of the membrane made of the fluoropolymer (A).

[4] The pellicle for lithography according to [1] or [2], wherein the multilayer pellicle membrane has a three-layer structure having a membrane made of the fluoropolymer (B) laminated on each side of the membrane made of the fluoropolymer (A).

[5] The pellicle for lithography according to any one of [1] to [4], wherein the entire thickness of the multilayer pellicle membrane is from 0.101 to 14 μm.

[6] The pellicle for lithography according to any one of [1] to [5], wherein the fluoropolymer (B) contains repeating units of at least one type selected from repeating units derived from a fluorinated compound represented by the following formula (b1) and repeating units derived from a fluorinated compound represented by the following formula (b2):

wherein $W^1$ is a fluorine atom, a $C_{1-3}$ perfluoroalkyl group or a $C_{1-3}$ perfluoroalkoxy group, each of $W^2$ and $W^3$ which are independent of each other, is a fluorine atom or a $C_{1-6}$ perfluoroalkyl group which may contain oxygen atoms, provided that $W^2$ and $W^3$ may be bonded to each other to form a ring structure, and each of $W^4$ and $W^5$ which are independent of each other, is a fluorine atom or a $C_{1-8}$ perfluoroalkyl group which may contain oxygen atoms, provided that $W^4$ and $W^5$ may be bonded to each other to form a ring structure.

[7] The pellicle for lithography according to any one of [1] to [6], wherein the perfluorodiene is a fluorinated compound represented by the following formula (a1):

wherein $W^6$ is a fluorine atom or a $C_{1-3}$ perfluoroalkyl group, and n is 0 or 1.

[8] A pellicle-mounted photomask which comprises a photomask and the pellicle for lithography as defined in any one of [1] to [7] mounted on one side or each side of the photomask.

[9] A pellicle-mounted photomask which comprises a photomask and the pellicle for lithography as defined in any one of [1] to [7] mounted on one side or each side of the photomask so that the outermost layer on the incidence side of exposure light of the multilayer pellicle membrane is the membrane made of the fluoropolymer (B).

[10] An exposure treatment method which comprises carrying out exposure treatment using a light source with an irradiation wavelength of at most 250 nm by means of the pellicle-mounted photomask as defined in [8] or [9].

Advantageous Effects of Invention

According to the present invention, it is possible to provide a pellicle for lithography having a pellicle membrane excellent in light resistance against light with a wavelength of at most 250 nm, particularly at most 200 nm, a pellicle-mounted photomask using such a pellicle, and an exposure treatment method.

DESCRIPTION OF EMBODIMENTS

In this specification, a compound represented by the formula (a) will be referred to also as a compound (a), and a repeating unit represented by the formula (A) will be referred to also as a repeating unit (A). A compound or repeating unit represented by another formula will also be referred to in the same way.

In this specification, a "perfluorodiene" is a chain perfluoro compound having two polymerizable double bonds, which may have an etheric oxygen atom.

An "alicyclic ring structure" means a saturated or unsaturated ring structure having no aromaticity.

A "fluorinated alicyclic ring structure" means an alicyclic ring structure having a fluorine atom or a fluorinated group bonded to at least one of carbon atoms constituting the main skeleton of the ring. The fluorinated group may, for example, be a perfluoroalkyl group, a perfluoroalkoxy group or a $=CF_2$ group.

A "fluorinated alicyclic ring structure containing, in the ring structure, two or three etheric oxygen atoms not being adjacent to one another" means a fluorinated alicyclic ring structure wherein two or three etheric oxygen atoms are bonded via at least one carbon atom i.e. without being adjacent to one another, to constitute a ring.

A "repeating unit derived from a compound" means a repeating unit formed by polymerization of the compound (monomer).

[Pellicle for Lithography]

The pellicle for lithography of the present invention is a pellicle for lithography having a multilayer pellicle membrane including a membrane (hereinafter referred to also as a "membrane (A)") made of a fluoropolymer (A) which contains, as the main component, repeating units obtained by cyclopolymerization of a perfluorodiene having one etheric oxygen atom, and a membrane (hereinafter referred to also as a "membrane (B)") made of a fluoropolymer (B) which has fluorinated alicyclic ring structures each containing, in the ring structure, two or three etheric oxygen atoms not being adjacent to one another, wherein the total thickness of the membrane (B) is at most 40% of the total thickness of the membrane (A).

Now, the construction of the pellicle for lithography (hereinafter sometimes referred to simply as the pellicle) of the present invention will be described with reference to the drawings.

Figure 1:
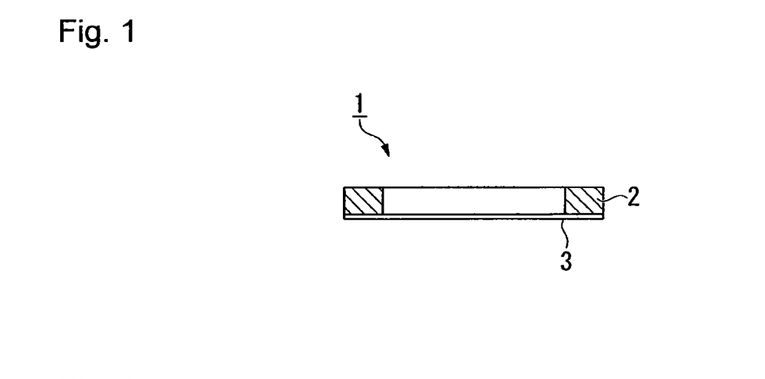
FIG. 1 is a schematic cross-sectional view illustrating one embodiment of the pellicle for lithography of the present invention.

One embodiment of the pellicle of the present invention is shown in FIG. 1. FIG. 1 is a schematic cross-sectional view illustrating the construction of the pellicle 1 of this embodiment.

The pellicle 1 of this embodiment has a structure wherein a multilayer pellicle membrane 3 is mounted on one side of a frame 2 for the pellicle.

(Frame 2)

As the frame 2, a conventional one may be used. As the material for the frame, a metal, ceramics or a hard plastic may, for example, be mentioned. A metal is preferred, and aluminum is particularly preferred, since it is light in weight and has good mechanical strength.

(Multilayer Pellicle Membrane 3)

The multilayer pellicle membrane 3 contains the membrane (A) and the membrane (B), and the total thickness of the membrane (B) is at most 40% of the total thickness of the membrane (A). Here, in a case where there are two or more layers of the same type of membrane, their total thickness is taken as the total thickness.

By adjusting the total thickness of the membrane (B) to be at most 40% of the total thickness of the membrane (A), the light resistance against light with a wavelength of at most 250 nm, particularly at most 200 nm, of the multilayer pellicle membrane 3 will be improved. The reason as to why such an effect is obtainable is not clear but is considered to be as follows.

The membrane (A) has high transparency to light with a wavelength of at most 250 nm and a high stress relaxation property, but the light resistance is insufficient. If a pellicle membrane is constituted solely by the membrane (A), a decrease in the membrane thickness, a decrease in the transparency, etc. due to deterioration are likely to result.

On the other hand, the membrane (B) has high transparency to light with a wavelength of at most 250 nm and is excellent also in light resistance. Under irradiation with light having a high energy of a wavelength of at most 250 nm, breakage is likely to occur between an etheric oxygen atom and a carbon atom in a polymer. Deterioration of the polymer is considered to be caused in such a manner that by moisture in the atmosphere, a molecular terminal at the broken portion of the polymer becomes to be a carbonyl group, and the carbonyl group absorbs light to generate radicals in the molecule. As compared to the fluoropolymer (A) constituting the membrane (A), the fluoropolymer (B) constituting the membrane (B) has a bulky structure in the vicinity of the etheric oxygen atoms, whereby it is considered less susceptible to an attack of moisture after the breakage between an etheric oxygen atom and a carbon atom, and the membrane is thus less likely to be deteriorated.

However, the membrane (B) becomes brittle, if the membrane thickness is made thick. If a pellicle membrane is constituted solely by the membrane (B), the membrane strength becomes insufficient.

In the present invention, it is possible to suppress deterioration of the membrane (A) by securing a sufficient membrane thickness by the membrane (A) and at the same time, by laminating the membrane (B), particularly on the incidence side of light. Besides, by lowering the ratio of the membrane (B), the strength and flexibility of the entire multilayer pellicle membrane will be good. Thus, a pellicle membrane excellent in light resistance and less susceptible to a decrease in the membrane thickness or a decrease in the transmittance over a long period of time, is considered to be obtainable.

The total thickness of the membrane (B) is preferably at most 40%, more preferably at most 20%, particularly preferably at most 10%, of the total thickness of the membrane (A). The lower limit is not particularly limited, but it is preferably at least 1%, particularly preferably at least 5%, of the total thickness of the membrane (A), whereby the effect to suppress deterioration of the membrane (A) is excellent.

The thickness of one layer of the membrane (A) is preferably from 0.1 to 10 μm, particularly preferably from 0.5 to 2 μm. When it is at least the lower limit value within the above range, the strength of the pellicle membrane will be excellent, and when it is at most the upper limit value within the above range, transmittance of light will be good.

The thickness of one layer of the membrane (B) is preferably from 0.001 to 4 μm, particularly preferably from 0.05 to 0.5 μm. When it is at least the lower limit value within the above range, the effect to suppress deterioration of the membrane (A) will be excellent, and when it is at most the upper limit value within the above range, the strength and flexibility of the entire multilayer pellicle membrane 3 will be good.

The entire thickness of the multilayer pellicle membrane 3 is preferably from 0.101 to 14 μm, particularly preferably from 0.55 to 2.5 μm. When it is at least the lower limit value within the above range and at most the upper limit value within the above range, transmittance of light will be good, and the strength and flexibility of the entire membrane will also be excellent. Further, also in a case where the after-mentioned membrane (C) is included, the preferred range of the entire thickness of the multilayer pellicle membrane 3 is the same.

The following (i) and (ii) may, for example, be mentioned as configurations of the multilayer pellicle membrane 3.

(i) A multilayer pellicle membrane comprising the membrane (A) and the membrane (B).

(ii) A multilayer pellicle membrane comprising the membrane (A), the membrane (B) and another membrane (hereinafter referred to also as a "membrane (C)") other than the membrane (A) and the membrane (B).

As the multilayer pellicle membrane of the above (i), preferred is a multilayer pellicle membrane having the membrane (B) laminated on one side or each side of the membrane (A). The membrane (B) has high light resistance against light with a wavelength of at most 250 nm, and by covering one side or each side of the membrane (A) with the membrane (B), deterioration of the membrane (A) when irradiated with light with a wavelength of at moat 250 nm, will be effectively suppressed.

In the multilayer pellicle membrane, the number of layers of membrane (A) may be one layer, or two or more layers. From the viewpoint of transmittance of light, from one to five layers are preferred, one or two layers are more preferred, and one layer is particularly preferred.

A multilayer pellicle membrane having one layer of membrane (A) may be one having a two-layer structure having the membrane (B) laminated on one side of the one layer of membrane (A), or one having at least three-layer structure having the membrane (B) laminated on at least each side of the one layer of membrane (A). The at least three-layer structure may, for example, be a three-layer structure of membrane (B)/membrane (A)/membrane (B) or a five-layer structure of membrane (B)/membrane (A)/membrane (B)/membrane (A)/membrane (B). Here, "/" indicates "laminated directly".

The multilayer pellicle membrane of the above (ii) may, for example, be one having the membrane (C) formed as an interlayer or as an outermost layer of the multilayer pellicle membrane of the above (i).

The membrane (C) may, for example, be a membrane made of a mixture of the fluoropolymer (A) and the fluoropolymer (B).

The thickness of the membrane (C) is preferably from 0.01 to 0.5 μm, particularly preferably from 0.01 to 0.1 μm, from the viewpoint of transparency.

As the configuration of the multilayer pellicle membrane 3, the multilayer pellicle membrane of the above (i) is preferred from the viewpoint of transmittance of light. Among them, one having a two-layer structure is particularly preferred from the viewpoint of costs, and one having a three-layer structure of membrane (B)/membrane (A)/membrane (B) is particularly preferred from the viewpoint of light resistance.

In the case of the two-layer structure, preferred thicknesses of the membrane (A) and the membrane (B) are as mentioned above. In the case of the three-layer structure, a preferred thickness of the membrane (A) is as mentioned above, and a preferred thickness of each membrane (B) is from 0.0005 to 2 μm, particularly preferably from 0.025 to 0.25 μm.

<Fluoropolymer (A)>

The fluoropolymer (A) is a polymer which contains, as the main component, repeating units (hereinafter referred to also as "repeating units (A1)") obtained by cyclopolymerization of a perfluorodiene having one etheric oxygen atom. The fluoropolymer (A) is an amorphous polymer, whereby the transparency is high. Further, it is excellent in flexibility, since it is a polymer containing, as the main component, repeating units (A1) obtained by cyclopolymerization of the perfluorodiene.

As the perfluorodiene having one etheric oxygen atom, the following compound (a1) is preferred from the viewpoint of the flexibility of the pellicle membrane.

When the compound (a1) is subjected to cyclopolymerization, the following repeating units (A1-1) to (A1-4), etc. will be formed.

In the formula (a1) and the formulae (A1-1) to (A1-4), $W^6$ is a fluorine atom or a $C_{1-3}$ perfluoroalkyl group, and n is 0 or 1.

The following compounds (a1-1) to (a1-3), etc. may be mentioned as specific examples of the compound (a1). From the viewpoint of the mechanical strength and transparency in addition to the flexibility of the pellicle membrane, compound (a1-1) i.e. perfluoro(butenyl vinyl ether) is particularly preferred.

As the perfluorodiene, one type may be used alone, or two or more types may be used in combination.

The fluoropolymer (A) contains repeating units (A1), as the main component. Here, "as the main component" means that the proportion of repeating units (A1) in the fluoropolymer (A), i.e. the proportion of repeating units (A1) occupying in all repeating units constituting the fluoropolymer (A), is at least 80 mol %.

The proportion of repeating units (A1) in the fluoropolymer (A) is preferably at least 80 mol %, more preferably at least 90 mol %, particularly preferably 100 mol %. At least the above lower limit value is preferred from the viewpoint of transparency. That is, particularly preferably, the fluoropolymer (A) is composed solely of units (A1).

The fluoropolymer (A) may contain repeating units (hereinafter referred to also as "repeating units (A2)") other than the repeating units (A1). The repeating units (A2) may be any units so long as they are repeating units derived from a compound (hereinafter referred to also as a "compound (a2)") copolymerizable with the perfluorodiene having one etheric oxygen atom.

However, the proportion of the repeating units (A2) is at most 20 mol %, preferably from 0 to 20 mol %, particularly preferably from 0 to 10 mol %, in all repeating units of the fluoropolymer (A).

The repeating units (A2) preferably contain repeating units (hereinafter referred to also as "repeating units (A2-1)") derived from a fluorinated compound represented by the following formula (a2-1) (hereinafter referred to also as a "compound (a2-1)") from the viewpoint of light resistance.

A repeating unit (A2-1) is represented by the following formula (A2-1).

In the formula (a2-1) and the formula (A2-1), $X^1$ is a fluorine atom, a $C_{1-8}$ perfluoroalkyl group or a $C_{1-8}$ perfluoroalkoxy group.

Specific examples of the compound (a2-1) may be tetrafluoroethylene (TFE), hexafluoropropylene (HFP), perfluoropropyl vinyl ether, etc.

The mass average molecular weight (Mw) of the fluoropolymer (A) is preferably from 50,000 to 1,000,000, particularly preferably from 50,000 to 500,000. When it is at least the lower limit value within the above range, the mechanical strength of the pellicle membrane will be good, and when it is at most the upper limit value within the above range, the pellicle membrane will be excellent in light transmittance.

Mw of the fluoropolymer (A) is a value to be measured by a gel permeation chromatography (GPC) method. Otherwise, it may be estimated from an intrinsic viscosity value obtained by an intrinsic viscosity method using a flow-down system viscosity tube.

The fluoropolymer (A) may be prepared by a known method. For example, it may be prepared by subjecting the compound (a1) to homopolymerization. As the polymerization method, radical polymerization may be used. That is, the polymerization means is not particularly limited so long as polymerization can be thereby radically proceeded. For example, polymerization by means of an organic or inorganic radical initiator, light, ionizing radiation or heat, may be mentioned. As the method for polymerization, bulk polymerization, solution polymerization, suspension polymerization or emulsion polymerization may, for example, be used.

In the fluoropolymer (A), an unstable terminal group may be converted to a stable terminal group by contacting the fluoropolymer immediately after polymerization, with fluorine gas. The method for contact with fluorine gas may, for example, be a method of contacting the fluoropolymer immediately after polymerization, with fluorine gas, or a method of contacting the fluoropolymer immediately after polymerization, with fluorine gas in such as state that the fluoropolymer is dissolved or dispersed in a fluorinated solvent. By the conversion to a stable terminal group, the transparency and light resistance will be further improved.

<Fluoropolymer (B)>

The fluoropolymer (B) is a polymer which has fluorinated alicyclic ring structures each containing, in the ring structure, two or three etheric oxygen atoms not being adjacent to one another. The fluoropolymer (B) is an amorphous polymer and thus has high transparency. Further, as mentioned above, the fluoropolymer (B) has a bulky structure in the vicinity of the etheric oxygen atoms, whereby deterioration of the polymer by irradiation with light is less likely to occur, and the light resistance is good. On the other hand, the fluoropolymer (B) is obtained by polymerizing a fluorinated compound having the above-mentioned fluorinated alicyclic ring structure and contains repeating units derived from such a fluorinated compound, whereby it lacks in flexibility.

As the fluorinated alicyclic ring, preferred is a fluorinated alicyclic ring of a dioxole structure containing two etheric oxygen atoms in the ring.

Further, as the fluorinated alicyclic ring, a perfluorinated alicyclic ring is preferred. The number of atoms constituting the ring skeleton of the fluorinated alicyclic ring is preferably from 4 to 7, particularly preferably 5 or 6. That is, the fluorinated alicyclic ring is preferably a 4- to 7-membered ring, particularly preferably a 5- or 6-membered ring.

It is preferred that the fluoropolymer (B) has the fluorinated alicyclic structures in its main chain. The expression "has . . . in its main chain" means that at least one of carbon atoms constituting the ring skeleton of each fluorinated alicyclic ring structure is a carbon atom constituting the main chain of the fluoropolymer (B).

As the fluoropolymer (B), preferred is one containing repeating units derived from a fluorinated compound which has a polymerizable double bond and a fluorinated alicyclic ring structure containing, in the ring structure, two or three etheric oxygen atoms being not adjacent to one another.

In the fluorinated compound, it is preferred that two carbon atoms constituting the polymerizable double bond are both contained in the ring structure, or one of them is contained in the ring structure and the other is not contained in the ring structure.

From the viewpoint of light resistance, it is preferred that the fluoropolymer (B) contains repeating units of at least one type selected from repeating units (hereinafter referred to also as "repeating units (B1)") derived from a fluorinated compound represented by the following formula (b1) (hereinafter referred to also as a "compound (b1)") and repeating units (hereinafter referred to also as "repeating units (B2)") derived from a fluorinated compound represented by the following formula (b2) (hereinafter referred to also as a "compound (b2)"). Either one or both of the repeating units (B1) and (B2) may be contained.

The repeating units (B1) and (B2) are represented by the following formulae (B1) and (B2), respectively.

(B2)

In the formula (b1) and the formula (B1), $W^1$ is a fluorine atom, a $C_{1-3}$ perfluoroalkyl group or a $C_{1-3}$ perfluoroalkoxy group. Each of $W^2$ and $W^3$ which are independent of each other is a fluorine atom or a $C_{1-6}$ perfluoroalkyl group which may contain oxygen atoms, provided that $W^2$ and $W^3$ may be bonded to each other to form a ring structure.

The ring structure which may be formed by $W^2$ and $W^3$ is preferably a 6-membered ring containing two etheric oxygen atoms.

In the formula (b2) and the formula (B2), each of $W^4$ and $W^5$ which are independent of each other is a fluorine atom or a $C_{1-8}$ perfluoroalkyl group which may contain oxygen atoms, provided that $W^4$ and $W^5$ may be bonded to each other to form a ring structure.

The ring structure which may be formed by $W^4$ and $W^5$ is preferably a 5-membered ring containing one etheric oxygen atom, or a 6-membered ring containing no etheric oxygen atom.

As specific examples of the compound (b1), compounds represented by the following formulae (b1-1) to (b1-4), etc. may be mentioned. Among them, a compound represented by the following formula (b1-1) i.e. perfluoro(2,2-dimethyl-1,3-dioxorane) (PDD) is preferred.

As the compound (b1), one type may be used alone, or two or more types may be used in combination.

(b1-1)

(b1-2)

(b1-3)

(b1-4)

As specific examples of the compound (b2), perfluoro(2-methylene-1,3-dioxorane) represented by the following formula (b2-1), perfluoro(2-methylene-4-methyl-1,3-dioxorane) (MMD) represented by the formula (b2-2), etc. may be mentioned.

As the compound (b2), one type may be used alone, or two or more types may be used in combination.

(b2-1)

(b2-2)

The fluoropolymer (B) may be a homopolymer or a copolymer, or a mixture of a homopolymer and a copolymer.

The fluoropolymer (B) contains repeating units of at least one type selected from the repeating units (B1) and the repeating units (B2) preferably in a proportion of at least 10 mol %, more preferably in a proportion of at least 50 mol %, particularly preferably in a proportion of at least 80 mol %, to all repeating units. The upper limit is not particularly limited, and it may be 100 mol %.

In a case where both of the repeating units (B1) and the repeating units (B2) are contained, the total of the repeating units (B1) and the repeating units (B2) is made to be preferably in a proportion of at least 10 mol %, more preferably in a proportion of at least 50 mol %, particularly preferably in a proportion of at least 80 mol %. The upper limit is not particularly limited, and it may be 100 mol %.

In a case where the fluoropolymer (B) contains repeating units (B1), the repeating units (B1) may be composed of one type only or may be composed of two or more types.

In a case where the fluoropolymer (B) contains repeating units (B2), the repeating units (B2) may be composed of one type only or may be composed of two or more types.

In a case where the fluoropolymer (B) contains repeating units (B1) and does not contain repeating units (B2), the proportion of the repeating units (B1) is preferably from 10 to 100 mol %, particularly preferably from 50 to 100 mol %, in all repeating units.

In a case where the fluoropolymer (B) does not contain repeating units (B1) and contains repeating units (B2), the proportion of the repeating units (B2) is preferably from 10 to 100 mol %, particularly preferably from 50 to 100 mol %, in all repeating units.

In a case where the fluoropolymer (B) contains both of repeating units (B1) and repeating units (B2), the proportion of the repeating units (B1) is preferably from 1 to 99 mol %, particularly preferably from 30 to 70 mol %, in all repeating units of the fluoropolymer (B). Further, the proportion of the repeating units (B2) is preferably from 1 to 99 mol %, particularly preferably from 30 to 70 mol %, in all repeating units of the fluoropolymer (B).

In this case, the molar ratio of the repeating units (B1) to the repeating units (B2), i.e. B1/B2, in the fluoropolymer (B) is preferably from 1/99 to 99/1, particularly preferably from 30/70 to 70/30.

The fluoropolymer (B) may contain repeating units (hereinafter referred to also as other repeating units) other than the repeating units (B1) and the repeating units (B2).

The content proportion of such other repeating units is preferably at most 90 mol %, more preferably at most 50 mol %, particularly preferably at most 20 mol %, to all repeating units.

Such other repeating units may be any repeating units so long as they are repeating units derived from a compound (hereinafter referred to also as a "compound (b3)") copolymerizable with the compound (b1) or the compound (b2).

The compound (b3) may, for example, be a chain perfluoro compound which has one or more polymerizable double bonds and may have an etheric oxygen atom, and one having one polymerizable double bond is preferred.

Specifically, such a perfluoro compound may, for example, be a perfluoroalkylene, a perfluoroalkyl vinyl ether, etc.

The number of carbon atoms in the perfluoroalkylene or the perfluoroalkyl vinyl ether is preferably from 2 to 10, particularly preferably from 2 to 5.

As the compound (b3), preferred is a compound represented by the following formula (b3-1) (hereinafter referred to also as a "compound (b3-1)").

A repeating unit derived from the compound (b3-1) is represented by the following formula (B3-1).

In the formula (b3-1) and the formula (B3-1), $X^2$ is a fluorine atom, a $C_{1-8}$ perfluoroalkyl group or a $C_{1-8}$ perfluoroalkoxy group.

The compound (b3-1) may, for example, be tetrafluoroethylene (TFE), hexafluoropropylene (HFP) or perfluoropropyl vinyl ether.

The mass average molecular weight (Mw) of the fluoropolymer (B) is preferably from 50,000 to 1,000,000, particularly preferably from 50,000 to 500,000. When it is at least the lower limit value within the above range, the pellicle membrane will be excellent in light resistance, and when it is at most the upper limit value within the above range, the mechanical strength of the pellicle membrane will be good.

Mw of the fluoropolymer (B) is a value to be measured by a GPC method. Otherwise, it may be estimated from an intrinsic viscosity value obtained by an intrinsic viscosity method using a flow-down system viscosity tube.

The fluoropolymer (B) may be prepared by a known method. For example, it may be prepared by subjecting the compound (b1) or the compound (b2) to homopolymerization or copolymerizing the compound (b1) and the compound (b2). Otherwise, the fluoropolymer (B) may be obtained by copolymerizing the compound (b1) and/or the compound (b2), and the compound (b3).

As the polymerization method, radical polymerization may be used. That is, the polymerization means is not particularly limited so long as polymerization can be thereby radically proceeded. For example, polymerization by means of an organic or inorganic radical initiator, light, ionizing radiation or heat, may be mentioned. As the method for polymerization, bulk polymerization, solution polymerization, suspension polymerization or emulsion polymerization may, for example, be used.

[Process for Producing Pellicle 1]

The pellicle 1 can be produced by fixing the multilayer pellicle membrane 3 to a frame 2 for a pellicle.

The fixing of the multilayer pellicle membrane 3 to the frame 2 may be carried out by a known process.

As a preferred process, a process may be mentioned in which the following steps (I) to (III) are carried out in this order.

(I) A step of forming a multilayer pellicle membrane 3 on a substrate surface to obtain a treated substrate, (II) a step of applying an adhesive to a frame 2, heating the frame 2 (preferably at from 100 to 200° C.) and contacting the surface of the frame 2 on which the adhesive is applied, with the multilayer pellicle membrane 3 side of the treated substrate, for bonding, and (III) a step of separating the substrate from the treated substrate having the frame 2 bonded thereto.

(Step (I))

As the method for forming a multilayer pellicle membrane 3 on a substrate, a usual method for forming a multilayer membrane may be employed. For example, a multilayer pellicle membrane 3 may be formed by repeating the following steps (Ia) and (Ib) depending upon the desired layer construction (the number of layers, the lamination order) of the multilayer pellicle membrane 3 to be formed:

(Ia) a step of dissolving a fluoropolymer (the fluoropolymer (A) or the fluoropolymer (B)) in a fluorinated solvent to prepare a solution composition for forming a membrane (A) or a membrane (B), and (Ib) a step of applying the solution composition on a substrate to form a coating membrane and drying the coating membrane to form a membrane made of the fluoropolymer.

Further, after forming the membrane of the first layer on the substrate, in step (Ib), the solution composition is applied on the membrane on the substrate, to form a multilayer membrane.

The frame 2 is bonded on the topmost layer (on the side opposite to the substrate) of the multilayer pellicle membrane 3 formed on the substrate in step (I). For this purpose, lamination is carried out in such a lamination order that when made into a pellicle 1, the layer in contact with the frame 2 would be the topmost layer.

As described in detail later, from the viewpoint of light resistance, the pellicle 1 is preferably fixed to a photomask so that the outermost layer, on the incidence side of light, of the multilayer pellicle membrane 3 would be a layer (B). For example, in the case of a pellicle 1 having a two-layer structure of layer (A)/layer (B), it is preferably fixed to a photomask so that light enters from the layer (B) side. As described above, the lamination order is set in consideration of how to fix the pellicle to the photomask. Here, in a case where the outermost layers on both sides of the multilayer pellicle membrane 3 are layers (B), the lamination order may not be seriously taken into consideration.

<Step (Ia)>

The fluorinated solvent is not particularly limited so long as it is one to dissolve a fluoropolymer (the fluoropolymer (A) or the fluoropolymer (B)). For example, a perfluoro compound may be used. Specific examples of the perfluoro compound may be perfluorotributylamine, perfluorotripropylamine, perfluorotripentylamine, perfluorooctane, perfluorodecane, perfluorohexane, perfluorobenzene, perfluoro-2-butyltetrahydrofuran and perfluorodecalin.

Specific examples of the fluorinated solvent other than the perfluoro compound may be decafluoro-3-methoxy-4-trifluoropentane, 1-ethoxy-nonafluorobutane, 1-methoxy-nonafluorobutane, 1,1,2,2-tetrafluoroethyl-2,2,2-trifluoroethyl ether, 1-hydrotridecafluorohexane, nonafluorohexane, 1,1,2,2,3,3,4-heptafluorocyclopentane, methyl tridecafluorohexyl ether and 1,1,2,2,3-pentafluoro-1,3-dichloropropane.

A fluorinated solvent to be used for the solution composition containing the fluoropolymer (A) and a fluorinated solvent to be used for the solution composition containing the fluoropolymer (B) may be the same or different.

The concentration of the fluoropolymer (the fluoropolymer (A) or (B)) in the solution composition containing the fluoropolymer is preferably from 1 to 13 mass %.

By adjusting the concentration of the polymer, it is possible to obtain the membrane (A) or the membrane (B) having a desired thickness.

<Step (Ib)>

As the substrate, one having a flat surface such as a silicon wafer or quartz glass is preferred.

As the coating method for the solution composition, a method of forming a membrane from a solution may be used. For example, a roll coating method, a casting method, a dipping method, a spin coating method, a casting-on-water method, a die coating method or a Langmuir-Blodgett method may, for example, be mentioned. In the case of a pellicle membrane, a spin coating method is preferred, since a very strict thickness forming is required.

The thickness of the coating membrane is set depending upon the desired thickness of the membrane (A) or (B) to be formed. Usually, it is selected within a range of from 0.01 to 50 µm.

The drying of the coating membrane is preferably carried out under reduced pressure, more preferably carried out at most at the vacuum pressure of 1 Pa (absolute pressure), particularly preferably at most $10^{-3}$ Pa (absolute pressure). As the temperature, at most 250° C. (the glass temperature of the fluorinated polymer) is preferable, 40 to 210° C. is particularly preferable.

The drying of the coating membrane is preferably carried out until the fluorinated solvent becomes to be less than the detectable limit. As the amount of the fluorinated solvent remaining in the pellicle membrane becomes less, it is possible to prevent a mutual interaction between short wavelength light and the fluorinated solvent in the pellicle membrane, and the transparency to short wavelength light, light resistance and mechanical strength will be further improved.

(Step (II))

As the adhesive to be applied to the frame 2, a known material may be used. As such an adhesive, preferred is a material having good adhesion to both of the frame 2 and the multilayer pellicle membrane 3. Further, a material additionally having durability against light to be used for exposure treatment is preferred, since at the time of exposure, light is exerted also to the adhesive, and the adhesion is likely to be deteriorated.

As an example of a preferred adhesive, an adhesive containing a fluoropolymer as the main component may be mentioned. The expression "containing the fluoropolymer as the main component" means that the fluoropolymer is contained in an amount of at least 80 mass % in the adhesive.

Such a fluoropolymer is preferably a vinylidene fluoride type copolymer such as a propylene/vinylidene fluoride/tetrafluoroethylene copolymer or a vinylidene fluoride/hexafluoropropylene copolymer. Further, a fluoropolymer having fluorinated alicyclic ring structures may be used. As such a fluoropolymer having fluorinated alicyclic ring structures, preferred is one which essentially contains repeating units obtained by cyclopolymerization of the compound (a1).

The fluoropolymer preferably has adhesive functional groups which exhibit adhesion to the frame 2 and the multilayer pellicle membrane 3.

The adhesive functional groups may be any ones so long as they exhibit adhesion to the frame 2 and the multilayer pellicle membrane 3. Such adhesive functional groups may, for example, be carboxylic acid groups, sulfonic acid groups, groups having an ester bond, alkenyl groups, hydrolysable silyl groups, hydroxy groups, maleimide groups, amino groups, cyano groups and isocyanate groups. As such adhesive functional groups, carboxylic acid groups are particularly preferred, whereby the adhesion to a metal such as aluminum being a common material for the frame is good, the storage stability is good, and the effect can be obtained at a relatively low temperature.

The fluoropolymer having adhesive functional groups may be produced by a method of introducing adhesive functional groups to a fluoropolymer precursor, and such a method is known (e.g. JP-A-4-189880, JP-A-4-226177, JP-A-6-220232 and JP-A-2001-330943). For example, there may be a method of utilizing terminal groups of a fluoropolymer precursor obtained by polymerization, a method of copolymerizing a fluorinated monomer having an alkoxycarbonyl group and hydrolyzing the obtained fluoropolymer precursor, or a method of subjecting a fluoropolymer precursor to high temperature treatment to oxidize and decompose side chains or terminals of the fluoropolymer precursor to form adhesive functional groups.

To the adhesive, a coupling agent of e.g. silane type, epoxy type, titanium type or aluminum type may be incorporated in order to improve the adhesion.

As the adhesive, one type may be used alone, or two or more types may be used in combination. For example, an adhesive containing a fluoropolymer having adhesive functional groups as the main component may be applied thinly on the frame 2, and a fluoropolymer having no adhesive functional group may be disposed thereon. In such as case, a firm bonding force will be obtainable when the frame 2 and the multilayer pellicle membrane 3 are bonded.

(Step (III))

As a method for separating the substrate from the treated substrate having the frame 2 bonded thereto, a method may, for example, be mentioned wherein after the frame 2 is bonded to the thin membrane, the obtained treated substrate is immersed in water to separate the substrate.

[Pellicle-Mounted Photomask]

The pellicle-mounted photomask is one having the pellicle of the present invention (the above-described pellicle) mounted on one side or each side of a photomask.

The photomask is not particularly limited, and a known photomask may be employed.

Mounting of the pellicle on the photomask may be carried out by a known method.

Figure 2:
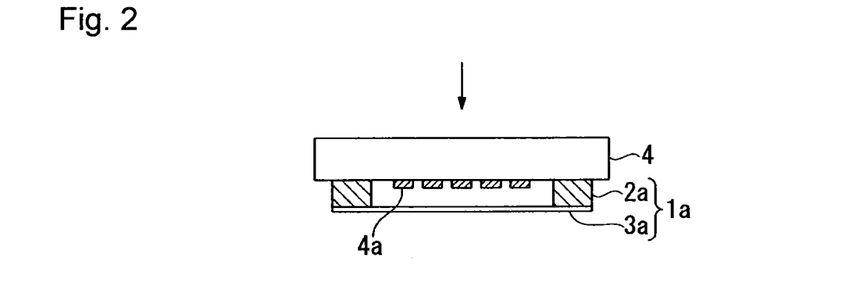
FIG. 2 is a schematic cross-sectional view illustrating one embodiment of the pellicle-mounted photomask of the present invention.
Figure 3:
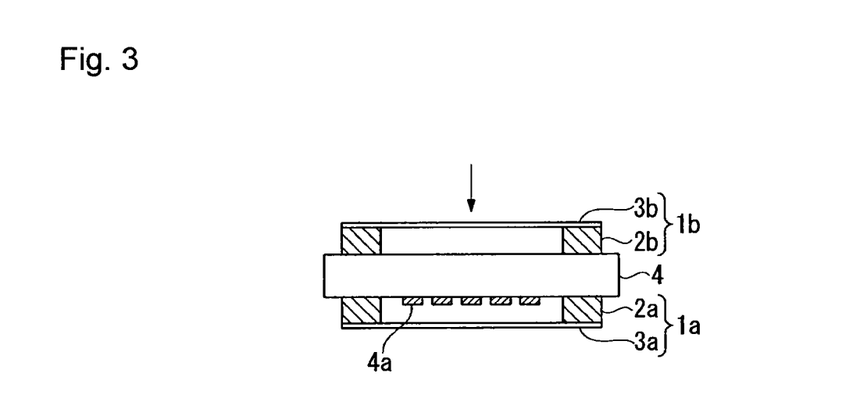
FIG. 3 is a schematic cross-sectional view illustrating one embodiment of the pellicle-mounted photomask of the present invention.

Embodiments of the pellicle-mounted photomask of the present invention are shown in FIGS. 2 and 3. In the following description of the embodiments, constituting elements corresponding to the above-described constituting elements will be identified by the same reference symbols, and their detailed descriptions will be omitted.

FIG. 2 is an example wherein a pellicle 1a is mounted on one side of the photomask 4 with a predetermined distance, and FIG. 3 is an example wherein pellicles 1a and 1b are mounted on both sides of the photomask 4 with a predetermined distance. The arrow in each of FIGS. 2 and 3 represents the incidence direction of light from an exposure light source.

The photomask 4 has such a structure that on one side of a transparent substrate, a film (hereinafter referred to also as a "patterned film") 4a made of a material not to transmit light is formed in a predetermined pattern, and a portion where no patterned film 4a is formed, is made to transmit light.

Each of pellicles 1a and 1b has such a structure that like the pellicle 1 shown in FIG. 1, a multilayer pellicle membrane 3a or 3b is fixed on one side of the frame 2a or 2b.

The pellicle 1a is mounted on the surface on the lower side (the opposite side to the incidence side of light) of the photomask 4 so that the opposite side of the frame 2a to the side where the frame 2a is bonded to the multilayer pellicle membrane 3a is in contact with the surface. That is, there is a distance between the lower side surface of the photomask 4 and the multilayer pellicle membrane 3a.

Likewise, the pellicle 1b is mounted on the surface on the upper side (the incidence side of light) of the photomask 4 so that the opposite side of the frame 2b to the side where the frame 2b is bonded to the multilayer pellicle membrane 3b is in contact with the surface. That is, there is a distance between the upper side surface of the photomask 4 and the multilayer pellicle membrane 3b.

Each of the pellicles 1a and 1b is preferably mounted so that the outermost layer on the incidence side of exposure light of the multilayer pellicle membrane 3a or 3b becomes layer (B). For example, in a case where the pellicle 1a has a pellicle membrane having a two-layer structure of layer (A)/ layer (B), it is preferred that the layer (B) is bonded to the frame 2a. Further, in a case where the pellicle 1b has a pellicle membrane having a two-layer structure of layer (A)/layer (B), it is preferred that the layer (A) is bonded to the frame 2b.

[Exposure Treatment Method]

The exposure treatment method of the present invention comprises carrying out exposure treatment using a light source with an irradiation wavelength of at most 250 nm by means of the above-described pellicle-mounted photomask of the present invention.

The exposure treatment method of the present invention may be carried out by a known method using a known exposure device such as an ArF excimer laser exposure device, except that as a photomask, the pellicle-mounted photomask of the present invention is employed.

Figure 4:
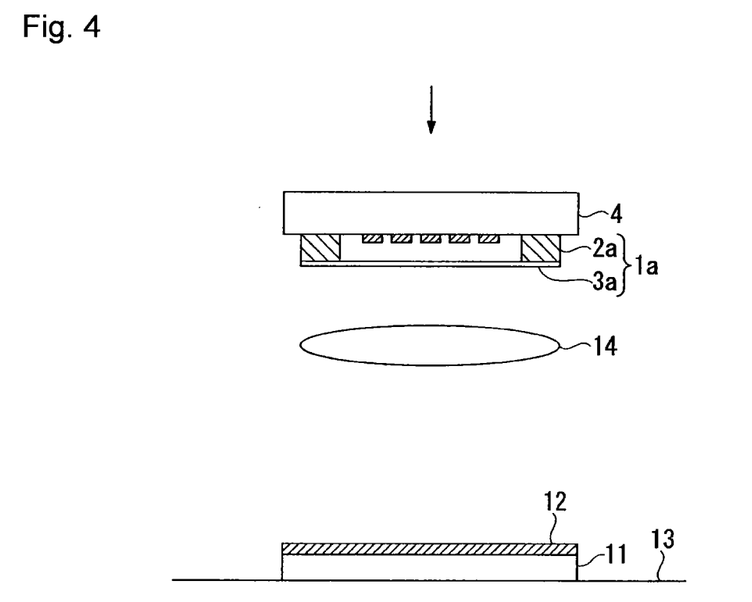
FIG. 4 is a schematic diagram showing one embodiment of the exposure treatment method of the present invention.

With reference to FIG. 4, one embodiment of the exposure treatment method of the present invention will be described.

In the exposure treatment method in this embodiment, firstly a photoresist is applied on a substrate 11 such as a silicon wafer, to form a resist film 12. The substrate 11 having the resist film 12 formed thereon is set on a substrate stage 13 of an exposure device (such as a stepper) provided with the exposure light source which is not described in the figure, the substrate stage 13, a lens 14 and a photomask 4 having a pellicle 1a mounted thereon, and irradiated with light (such as ArF excimer laser light) from an exposure light source, whereby a pattern of the photomask 4 is reduced by the lens 14 and projected and exposed on the resist film 12.

Thereafter, the resist film 12 is subjected to development, whereby the resist film 12 is patterned to have a predetermined pattern. By using the resist film 12 thus patterned as a mask, etching is carried out whereby the substrate 11 is patterned to have a predetermined pattern.

The exposure light source may be any one so long as the irradiation wavelength is at most 250 nm. For example, KrF excimer laser (248 nm) or ArF excimer laser (198 nm) may be mentioned. Among them, a light source with a wavelength of at most 200 nm is preferred, and ArF excimer laser (198 nm) is particularly preferred.

The exposure treatment may be carried out by dry exposure or by liquid immersion exposure. The dry exposure is a commonly employed method wherein exposure is carried out in such a state that air is filled between the lens 14 and the resist film 12. The liquid immersion exposure is a method wherein exposure is carried out in such a state that, instead of air, a liquid medium such as water is filled between the lens 14 and the resist film 12.

EXAMPLES

Now, specific examples of the above embodiments will be described as Examples. However, it should be understood that the present invention is by no means restricted by the following Examples.

Among the following Examples 1 to 8, pellicle membranes obtained in Examples 1 to 4 and 8 correspond to multilayer pellicle membranes in the present invention, and pellicle membranes obtained in Examples 5 to 7 are comparative products.

[Evaluation Methods]
(Static Contact Angle)

When a water droplet of 2 μL was formed on a surface of a substrate having a material applied to the surface, the contact angle of the water droplet was measured by means of a contact angle meter DM-700, manufactured by Kyowa Interface Science Co., Ltd.

(Dynamic Tumbling Down Angle, Dynamic Backdown Angle)

When a water droplet of 50 μL was formed on a surface of a substrate having a material applied to the surface, and the substrate was inclined, the inclination angle at the time when the waterdroplet started to tumble down was taken as the dynamic tumbling down angle, and the contact angle of the water droplet at that time, at the rear side in the tumbling direction, was taken as the dynamic backdown angle, and the respective angles were measured by means of a contact angle meter DM-700, manufactured by Kyowa Interface Science Co., Ltd.

Production Example 1

Production of Solution Composition (A-11)

(Synthesis of Fluoropolymer (A-1))

In accordance with Synthesis Example 3 in Japanese Patent No. 2,952,962, compound (a1-1) was subjected to homopolymerization to synthesize a fluoropolymer (A-1).

(Preparation of Solution Composition)

0.1 g of the obtained fluoropolymer (A-1) was dissolved in 1.0 g of perfluorotributylamine and then filtered through a filter (made of polyether sulfone) with a pore diameter of 1.0 μm, to obtain a solution composition (A-11) containing 10 mass % of the fluoropolymer (A-1). It was visually confirmed that in the composition, the fluoropolymer (A-1) was uniformly dissolved.

Production Example 2

Production of Solution Composition (B-11)

(Synthesis of fluoropolymer (B-1))

1.5 g of compound (b1-1) and 21.7 g of dicyclopentafluoropropane (manufactured by Asahi Glass Company Limited) were charged into a 0.1L pressure resistant container. To the pressure resistant container, ASAHIKLIN AK-225 solution containing 3 mass % of bis(heptafluorobutylyl) peroxide (PFB) was added as a polymerization initiator. After deaerating the interior of the system under reduced pressure, 1.0 g of tetrafluoroethylene (TFE) was fed and polymerized at 40° C.

for 3 hours. After the polymerization, the reaction solution was dropped into methanol to precipitate a polymer again, followed by vacuum drying at 100° C. for 12 hours and at 200° C. for one hour and then by thermal treatment at 300° C. for one hour, to obtain a fluoropolymer (B-1).

(Preparation of Solution Composition)

Using the obtained fluoropolymer (B-1), in the same manner as in Production Example 1, a solution composition (B-11) containing 10 mass % of the fluoropolymer (B-1) was obtained. It was visually confirmed that in the composition, the fluoropolymer (B-1) was uniformly dissolved.

Production Example 3

Production of Solution Composition (B-12)

The solution composition (B-12) was obtained in the same manner as in Production Example 2, except that the concentration of the fluoropolymer (B-1) was made to be 3 mass %. It was visually confirmed that in the composition, the fluoropolymer (B-1) was uniformly dissolved.

Production Examples 4 and 5

Production of Solution Compositions (B-21) and (B-22)

0.8 g of compound (b2-2) and 0.28 g of 1-H-perfluorohexane were charged into a 0.01 L pressure resistant container. To the pressure resistant container, ASAHIKLIN AK-225 solution containing 3 mass % of PFB was added as a polymerization initiator. After deaerating the interior of the system under reduced pressure, polymerization was carried out at 40° C. for 3 hours. After the polymerization, the reaction solution was dropped into methanol to precipitate a polymer again, followed by vacuum drying at 100° C. for 12 hours and at 200° C. for one hour and then by thermal treatment at 300° C. for one hour, to obtain a fluoropolymer (B-2).

Using the obtained fluoropolymer (B-2), in the same manner as in Production Example 2, a solution composition (B-21) was obtained, and in the same manner as in Production Example 3, a solution composition (B-22) was obtained. It was visually confirmed that in the respective compositions, the fluoropolymer (B-2) was uniformly dissolved.

Production Example 6

Production of Solution Composition (B-31)

A fluoropolymer (B-3) was synthesized and a solution composition (B-31) was obtained in the same manner as in Production Example 2 except that instead of the compound (b1-1), a compound (b2-2) was used. It was visually confirmed that in the composition, the fluoropolymer (B-3) was uniformly dissolved.

Production Example 7

Production of Solution Composition (A-21)

The fluoropolymer (A-1) produced in Production Example 1 was subjected to conversion of unstable terminal groups to stable terminal groups in accordance with Example 4 in Japanese Patent No. 3,818,344, to obtain the fluoropolymer (A-2). Using the obtained fluoropolymer (A-2), in the same manner as in Production Example 1, a solution composition (A-21) was obtained. It was visually confirmed that in the composition, the fluoropolymer (A-2) was uniformly dissolved.

TABLE 1

| | Solution composition | Fluoro-polymer | Monomer composition | Copolymerization compositional ratio (molar ratio) |
|---|---|---|---|---|
| Production Example 1 | (A-11) | (A-1) | (a1-1) | — |
| Production Example 2 | (B-11) | (B-1) | (b1-1)/TFE | 65/35 |
| Production Example 3 | (B-12) | (B-1) | (b1-1)/TFE | 65/35 |
| Production Example 4 | (B-21) | (B-2) | (b2-2) | — |
| Production Example 5 | (B-22) | (B-2) | (b2-2) | — |
| Production Example 6 | (B-31) | (B-3) | (b2-2)/TFE | 52/48 |
| Production Example 7 | (A-21) | (A-2) | (a1-1) | — |

Examples 1 to 3

On a silicon substrate, the solution composition (A-11) was applied by spin coating and dried by heating at 80° C. for 90 seconds and further by heat treatment at 200° C. for 180 seconds to form a membrane (A-1) made of the fluoropolymer (A-1) and having a thickness of 0.8 μm. Then, on the membrane (A-1), the solution composition (B-12), (B-22) or (B-31) was applied by spin coating and dried by heating at 80° C. for 90 seconds and further by heat treatment at 200° C. for 180 seconds to form a membrane (B-1), (B-2) or (B-3) made of the fluoropolymer (B-1), (B-2) or (B-3), respectively, and having a thickness of 80 nm. That is, on the substrate, a pellicle membrane (1), (2) or (3) having a two-layer structure was formed. The layer structure of each pellicle membrane and the proportion of the total thickness of the membrane (B) to the total thickness of the membrane (A) are shown in Table 2.

With respect to the obtained pellicle membranes (1) to (3), the respective static contact angles, dynamic tumbling angles and dynamic backdown angles to pure water on the membranes (B-1) to (B-3) side surfaces, respectively, were measured. The measurement results are shown in Table 3. In the Table, the unit for each of the static contact angle, dynamic tumbling angle and dynamic backdown angle is an angle degree) (°).

Figure 5:
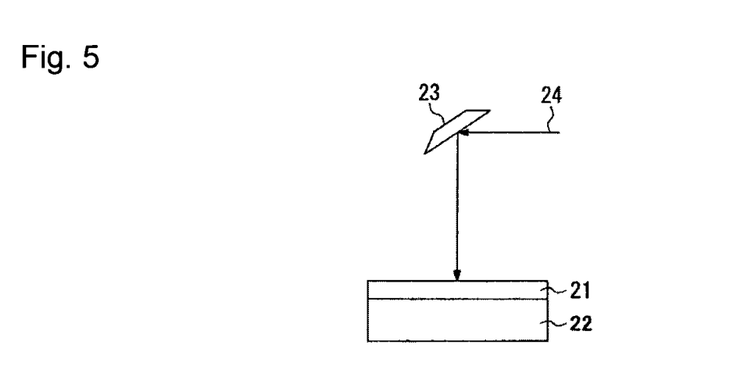
FIG. 5 is a schematic diagram showing the light resistance test method used in Examples.

Then, to the obtained pellicle membranes (1) to (3), an ArF excimer laser light was applied in the procedure as shown in FIG. 5. That is, in an exposure device equipped with an ArF excimer laser light source, the silicon substrate 22 having the pellicle membrane 21 (the pellicle membrane (1), (2) or (3)) formed thereon was set, and an ArF excimer laser light 24 (wavelength: 193 nm) was reflected by a mirror 23 and applied to the pellicle membrane 21. The ArF excimer laser light 24 was applied to an area of about 3 cm³ in an integral light quantity of 2 kJ/cm² under a condition of from 2.6 to 2.7 mJ/cm/pulse (frequency: 110 Hz).

After the irradiation with the ArF excimer laser light, the static contact angles, dynamic tumbling angles and dynamic backdown angles to pure water on the membranes (B-1) to (B-3) side surfaces of the pellicle membranes (1) to (3), were, respectively, measured. The measurement results are shown in Table 3.

Example 4

On a silicon substrate, the solution composition (B-22) was applied by spin coating and dried by heating at 80° C. for 90 seconds and further by heat treatment at 200° C. for 180 seconds to form a membrane (B-2) made of the fluoropolymer (B-2) and having a thickness of 80 nm. Then, on the membrane (B-2), the solution composition (A-11) was applied by spin coating and dried by heating at 80° C. for 90 seconds and further by heat treatment at 200° C. for 180 seconds to form a membrane (A-1) made of the fluoropolymer (A-1) and having a thickness of 0.8 μm. Then, on the membrane (A-1), the solution composition (B-22) was applied by spin coating and dried by heating at 80° C. for 90 seconds and further by heat treatment at 200° C. for 180 seconds to form a membrane (B-2) made of the fluoropolymer (B-2) and having a thickness of 80 nm. That is, on the substrate, a pellicle membrane (4) having a three-layer structure having the membrane (B-2), the membrane (A-1) and the membrane (B-2) laminated in this order, was formed. The layer structure of the pellicle membrane and the proportion of the total thickness of the membrane (B) to the total thickness of the membrane (A) are shown in Table 2.

With respect to the obtained pellicle membrane (4), the static contact angle, dynamic tumbling angle and dynamic backdown angle to pure water on the membrane (B-2) side surface were, respectively, measured. The measurement results are shown in Table 3.

Then, in the same manner as in Examples 1 to 3, an ArF excimer laser light was applied, and the static contact angle, dynamic tumbling angle and dynamic backdown angle to pure water on the membrane (B-2) side surface, after the irradiation, were, respectively, measured. The measurement results are shown in Table 3.

Example 5

On a silicon substrate, the solution composition (A-11) was applied by spin coating and dried by heating at 80° C. for 90 seconds and further by heat treatment at 200° C. for 180 seconds to form a pellicle membrane (5) composed solely of a membrane (A-1) made of the fluoropolymer (A-1) and having a thickness of 0.8 μm. The layer structure of the pellicle membrane and the proportion of the total thickness of the membrane (B) to the total thickness of the membrane (A) are shown in Table 2.

With respect to the obtained pellicle membrane (5), the static contact angle, dynamic tumbling angle and dynamic backdown angle to pure water of the membrane (A-1) were, respectively, measured. The measurement results are shown in Table 3.

Then, in the same manner as in Examples 1 to 3, an ArF excimer laser light was applied, and the static contact angle, dynamic tumbling angle and dynamic backdown angle to pure water of the membrane (A-1), after the irradiation, were, respectively, measured. The measurement results are shown in Table 3.

Example 6

On a silicon substrate, the solution composition (B-21) was applied by spin coating and dried by heating at 80° C. for 90 seconds and further by heat treatment at 200° C. for 180 seconds to form a pellicle membrane (6) composed solely of a membrane (B-2) made of the fluoropolymer (B-2) and having a thickness of 0.8 μm. The layer structure of the pellicle membrane and the proportion of the total thickness of the membrane (B) to the total thickness of the membrane (A) are shown in Table 2.

With respect to the obtained pellicle membrane (6), the static contact angle, dynamic tumbling angle and dynamic backdown angle to pure water of the membrane (B-2) were, respectively, measured. The measurement results are shown in Table 3.

Then, in the same manner as in Examples 1 to 3, an ArF excimer laser light was applied, whereby breakage of the membrane was observed, and therefore, the static contact angle, dynamic tumbling angle and dynamic backdown angle to pure water of the membrane (B-2) after the irradiation were not measured.

Example 7

On a silicon substrate, the solution composition (A-11) was applied by spin coating and dried by heating at 80° C. for 90 seconds and further by heat treatment at 200° C. for 180 seconds to form a membrane (A-1) made of the fluoropolymer (A-1) and having a thickness of 0.8 μm. Then, on the membrane (A-1), the solution composition (B-11), was applied by spin coating and dried by heating at 80° C. for 90 seconds and further by heat treatment at 200° C. for 180 seconds to form a membrane (B-1) made of the fluoropolymer (B-1) and having a thickness of 0.8 μm. That is, on the substrate, a pellicle membrane (7) having a two-layer structure with layers of the same thickness was formed. The layer structure of the pellicle membrane and the proportion of the total thickness of the membrane (B) to the total thickness of the membrane (A) are shown in Table 2.

With respect to the obtained pellicle membrane (7), the static contact angle, dynamic tumbling angle and dynamic backdown angle to pure water of the membrane (B-1) were, respectively, measured. The measurement results are shown in Table 3.

Then, in the same manner as in Examples 1 to 3, an ArF excimer laser light was applied, whereby breakage of the membrane was observed, and therefore, the static contact angle, dynamic tumbling angle and dynamic backdown angle to pure water on the membrane (B-1) side surface after the irradiation were not measured.

Example 8

A pellicle membrane (8) was formed in the same manner as in Example 1 except that the solution composition (A11) was changed to the solution composition (A-21). The layer structure of the pellicle membrane and the proportion of the total thickness of the membrane (B) to the total thickness of the membrane (A) are shown in Table 2.

With respect to the obtained pellicle membrane (8), the static contact angle, dynamic tumbling angle and dynamic backdown angle to pure water of the membrane (B-1) were, respectively, measured. The measurement results are shown in Table 3. Further, the static contact angle, dynamic tumbling angle and dynamic backdown angle to pure water on the membrane (B-1) side surface after irradiation with an ArF excimer laser light, were, respectively, measured. The measurement results are shown in Table 3.

TABLE 2

| Pellicle membrane | | Layer structure | Total thickness of membrane (B) to total thickness of membrane (A) |
|---|---|---|---|
| Ex. 1 | (1) | substrate/membrane (A-1)/ membrane (B-1) | 10% |
| Ex. 2 | (2) | substrate/membrane (A-1)/ membrane (B-2) | 10% |

TABLE 2-continued

| Pellicle membrane | | Layer structure | Total thickness of membrane (B) to total thickness of membrane (A) |
|---|---|---|---|
| Ex. 3 | (3) | substrate/membrane (A-1)/membrane (B-3) | 10% |
| Ex. 4 | (4) | substrate/membrane (B-2)/membrane (A-1)/membrane (B-2) | 20% |
| Ex. 5 | (5) | substrate/membrane (A-1) | — |
| Ex. 6 | (6) | substrate/membrane (B-2) | — |
| Ex. 7 | (7) | substrate/membrane (A-1)/membrane (B-1) | 100% |
| Ex. 8 | (8) | substrate/membrane (A-2)/membrane (B-1) | 10% |

TABLE 3

| | | Immediately after production | | | After irradiation with ArF excimer laser light | | |
|---|---|---|---|---|---|---|---|
| | Pellicle membrane | Static contact angle | Dynamic tumbling angle | Dynamic backdown angle | Static contact angle | Dynamic tumbling angle | Dynamic backdown angle |
| Ex. 1 | (1) | 120 | 6 | 114 | 114 | 9 | 110 |
| Ex. 2 | (2) | 119 | 6 | 114 | 114 | 10 | 111 |
| Ex. 3 | (3) | 114 | 5 | 112 | 113 | 9 | 109 |
| Ex. 4 | (4) | 117 | 5 | 113 | 116 | 5 | 108 |
| Ex. 5 | (5) | 114 | 8 | 106 | 52 | 22 | 35 |
| Ex. 6 | (6) | 118 | 6 | 112 | Breakage of membrane | | |
| Ex. 7 | (7) | 119 | 6 | 115 | Breakage of membrane | | |
| Ex. 8 | (8) | 120 | 6 | 114 | 114 | 9 | 111 |

From the above results, it is evident that with respect to the pellicle membranes in Examples 1 to 4 and 8, no substantial change was observed in each value of the static contact angle, dynamic tumbling angle and dynamic backdown angle as between before and after irradiation with the ArF excimer laser light, and sufficient water repellency was maintained even after irradiation with the ArF excimer laser light. That is, it is evident that the multilayer pellicle membrane in each Example had good laser light resistance. Especially with the multilayer pellicle membrane having a three-layer structure in Example 4, it was confirmed that decrease in the static contact angle, dynamic tumbling angle and dynamic backdown angle was little, and sufficient water repellency was maintained.

Whereas, with the pellicle membrane in Example 5 being the membrane (A-1) made of the fluoropolymer (A-1) obtained by homopolymerization of the compound (a1-1), each value of the static contact angle, dynamic tumbling angle and dynamic backdown angle was changed substantially by irradiation with the ArF excimer laser light, and the water repellency was also remarkably deteriorated. That is, it is evident that the laser light resistance was insufficient.

With the pellicle membrane in Example 6 being the membrane (B-2) made of the fluoropolymer (B-2), the membrane strength was deteriorated by irradiation with the ArF excimer laser light, and breakage of the membrane resulted.

With the pellicle membrane in Example 7 having a two-layer structure wherein the total thickness of the membrane (B-2) to the total thickness of the membrane (A-1) was 100%, the membrane strength was deteriorated by irradiation with the ArF excimer laser light, and breakage of the membrane resulted. Thus, it is evident that the laser light resistance was insufficient.

INDUSTRIAL APPLICABILITY

The multilayer pellicle membrane in the present invention exhibits high light resistance and high mechanical strength against irradiation with a short wavelength light having a wavelength of at most 250 nm such as KrF excimer laser (248 nm) light or ArF excimer laser (193 nm) light, particularly light of at most 200 nm. Accordingly, elongation or breakage of the pellicle membrane scarcely occurs. Therefore, it is possible to produce the pellicle in good yield. Further, in exposure treatment using the pellicle, it is possible to prevent deterioration of the pellicle membrane even if the pellicle is used for a long period of time, and therefore, a lithography step can be carried out under a stabilized condition.

This application is a continuation of PCT Application No. PCT/JP2012/069234, filed on Jul. 27, 2012, which is based upon and claims the benefit of priority from Japanese Patent Application No. 2011-166547 filed on Jul. 29, 2011. The contents of those applications are incorporated herein by reference in its entirety.

REFERENCE SYMBOLS 1, 1a, 1b: pellicle, 2, 2a, 2b: frame, 3, 3a, 3b: multilayer pellicle membrane, 4: photomask, 11: substrate, 12: resist film, 13: substrate stage, 14: lens, 21: pellicle membrane, 22: silicon substrate, 23: mirror, 24: ArF excimer laser light

What is claimed is:

1. A pellicle for lithography having a multilayer pellicle membrane including a membrane made of a fluoropolymer (A) which contains, as the main component, repeating units obtained by cyclopolymerization of a perfluorodiene having one etheric oxygen atom, and a membrane made of a fluoropolymer (B) which has fluorinated alicyclic ring structures each containing, in the ring structure, two or three etheric oxygen atoms not being adjacent to one another, wherein the total thickness of the membrane made of the fluoropolymer (B) is at most 40% of the total thickness of the membrane made of the fluoropolymer (A).

2. The pellicle for lithography according to claim 1, wherein the multilayer pellicle membrane is a multilayer pellicle membrane having a membrane made of the fluoropolymer (B) laminated on one side or each side of the membrane made of the fluoropolymer (A).

3. The pellicle for lithography according to claim 1, wherein the multilayer pellicle membrane has a two-layer structure having a membrane made of the fluoropolymer (B) laminated on one side of the membrane made of the fluoropolymer (A).

4. The pellicle for lithography according to claim 1, wherein the multilayer pellicle membrane has a three-layer structure having a membrane made of the fluoropolymer (B) laminated on each side of the membrane made of the fluoropolymer (A).

5. The pellicle for lithography according to claim 1, wherein the entire thickness of the multilayer pellicle membrane is from 0.101 to 14 μm.

6. The pellicle for lithography according to claim 1, wherein the fluoropolymer (B) contains repeating units of at least one type selected from repeating units derived from a fluorinated compound represented by the following formula (b1) and repeating units derived from a fluorinated compound represented by the following formula (b2):

(b1)

(b2)

wherein $W^1$ is a fluorine atom, a $C_{1-3}$ perfluoroalkyl group or a $C_{1-3}$ perfluoroalkoxy group, each of $W^2$ and $W^3$ which are independent of each other, is a fluorine atom or a $C_{1-6}$ perfluoroalkyl group which may contain oxygen atoms, provided that $W^2$ and $W^3$ may be bonded to each other to form a ring structure, and each of $W^4$ and $W^5$ which are independent of each other, is a fluorine atom or a $C_{1-8}$ perfluoroalkyl group which may contain oxygen atoms, provided that $W^4$ and $W^5$ may be bonded to each other to form a ring structure.

7. The pellicle for lithography according to claim 1, wherein the perfluorodiene is a fluorinated compound represented by the following formula (a1):

(a1)

wherein $W^6$ is a fluorine atom or a $C_{1-3}$ perfluoroalkyl group, and n is 0 or 1.

8. A pellicle-mounted photomask which comprises a photomask and the pellicle for lithography as defined in claim 1 mounted on one side or each side of the photomask.

9. A pellicle-mounted photomask which comprises a photomask and the pellicle for lithography as defined in claim 1 mounted on one side or each side of the photomask so that the outermost layer on the incidence side of exposure light of the multilayer pellicle membrane is the membrane made of the fluoropolymer (B).

10. An exposure treatment method which comprises carrying out exposure treatment using a light source with an irradiation wavelength of at most 250 nm by means of the pellicle-mounted photomask as defined in claim 8.

* * * * *